United States Patent
Ahn et al.

(10) Patent No.: US 10,910,601 B2
(45) Date of Patent: Feb. 2, 2021

(54) DISPLAY DEVICE AND ELECTRONIC DEVICE HAVING SAME

(71) Applicant: Samsung Electronics Co., Ltd., Gyeonggi-do (KR)

(72) Inventors: Sung-Ho Ahn, Seoul (KR); Hak-Yeol Kim, Gyeonggi-do (KR); Sung-Gwan Woo, Gyeonggi-do (KR); Song-Hee Jung, Chungcheongbuk-do (KR); Dong-Sub Kim, Gyeonggi-do (KR); Byeong-Cheol Kim, Gyeonggi-do (KR)

(73) Assignee: Samsung Electronics Co., Ltd (KR)

( * ) Notice: Subject to any disclaimer, the term of this patent is extended or adjusted under 35 U.S.C. 154(b) by 0 days.

(21) Appl. No.: 15/574,076

(22) PCT Filed: May 16, 2016

(86) PCT No.: PCT/KR2016/005183
§ 371 (c)(1),
(2) Date: Nov. 14, 2017

(87) PCT Pub. No.: WO2016/182416
PCT Pub. Date: Nov. 17, 2016

(65) Prior Publication Data
US 2018/0301664 A1 Oct. 18, 2018

(30) Foreign Application Priority Data

May 14, 2015 (KR) .................. 10-2015-0067377

(51) Int. Cl.
*H01L 33/00* (2010.01)
*H01L 51/52* (2006.01)
(Continued)

(52) U.S. Cl.
CPC ........ *H01L 51/5275* (2013.01); *G02F 1/1335* (2013.01); *G02F 1/133305* (2013.01);
(Continued)

(58) Field of Classification Search
CPC ... H01L 27/32; H01L 27/323; H01L 51/0097; H01L 51/5281
(Continued)

(56) References Cited

U.S. PATENT DOCUMENTS 7,745,996 B2 * 6/2010 Lim .................. G02B 5/22
313/110
8,693,173 B2 * 4/2014 Kim .................. H04N 5/64
361/679.01
(Continued)

FOREIGN PATENT DOCUMENTS

CN 103187426 7/2013
JP 2010266603 11/2010
(Continued)

OTHER PUBLICATIONS

European Search Report dated Mar. 8, 2018 issued in countrpart application No. 16793062.7-1210, 9 pages.
(Continued)

*Primary Examiner* — Tan N Tran
(74) *Attorney, Agent, or Firm* — The Farrell Law Firm, P.C.

(57) ABSTRACT

Disclosed in various examples of the present invention are a display device and an electronic device having the same, the display device comprising: a display element; and a guide unit arranged on the display element, wherein the guide unit guides a propagation pathway of the light emitted from the display element. The display device and the electronic device having the same can provide a comfortable viewing environment by using the guide unit so as to guide the propagation pathway of the light emitted from the display element. The display device and the electronic device having the same can be variously implemented according to the examples.

19 Claims, 14 Drawing Sheets

(51) Int. Cl.
  *G09F 9/30*  (2006.01)
  *G02F 1/1335*  (2006.01)
  *H01L 27/32*  (2006.01)
  *G02F 1/1333*  (2006.01)
  *H01L 51/00*  (2006.01)

(52) U.S. Cl.
  CPC .. *G02F 1/133308* (2013.01); *G02F 1/133502* (2013.01); *G02F 1/133524* (2013.01); *G09F 9/30* (2013.01); *H01L 27/32* (2013.01); *H01L 27/323* (2013.01); *H01L 51/0097* (2013.01); *H01L 51/5281* (2013.01); *G02F 2001/133331* (2013.01); *G02F 2203/023* (2013.01); *H01L 2251/5338* (2013.01)

(58) Field of Classification Search
  USPC ....................................................... 257/88, 98
  See application file for complete search history.

(56) References Cited

U.S. PATENT DOCUMENTS

| | | | | |
|---|---|---|---|---|
| 8,926,158 | B2* | 1/2015 | Holman | F21V 17/16 |
| | | | | 362/612 |
| 2006/0050169 | A1 | 3/2006 | Misawa | |
| 2008/0049174 | A1 | 2/2008 | Kim | |
| 2012/0200933 | A1 | 8/2012 | Akiyama et al. | |
| 2012/0218696 | A1 | 8/2012 | Kim et al. | |
| 2013/0202867 | A1* | 8/2013 | Coggio | G02B 1/105 |
| | | | | 428/216 |
| 2013/0242399 | A1 | 9/2013 | Tsuboi et al. | |
| 2014/0016071 | A1 | 1/2014 | Yang et al. | |
| 2014/0133073 | A1 | 5/2014 | Ahn et al. | |
| 2015/0116852 | A1 | 4/2015 | Kim et al. | |

FOREIGN PATENT DOCUMENTS

| | | |
|---|---|---|
| JP | 2011102977 | 5/2011 |
| KR | 1020080017777 | 2/2008 |
| KR | 101097430 | 12/2011 |
| KR | 1020110132802 | 12/2011 |
| KR | 1020130138394 | 12/2013 |
| KR | 1020140060078 | 5/2014 |
| KR | 1020140081482 | 7/2014 |
| KR | 1020140085292 | 7/2014 |
| KR | 1020150049859 | 5/2015 |

OTHER PUBLICATIONS

PCT/ISA/237 Written Opinion issued on PCT/KR2016/005183 (pp. 6).
PCT/ISA/210 Search Report issued on PCT/KR2016/005183 (pp. 3).
Chinese Office Action dated Oct. 14, 2019 issued in countrpart application No. 201680027926.7, 18 pages.

* cited by examiner

DISPLAY DEVICE AND ELECTRONIC DEVICE HAVING SAME

PRIORITY

This application is a National Phase Entry of International Application No. PCT/KR2016/005183, which was filed on May 16, 2016, and claims priority to Korean Patent Application No. 10-2015-0067377 filed on May 14, 2015, the content of each of which is incorporated herein by reference.

TECHNICAL FIELD

The present disclosure relates to a display device and an electronic device including the same.

BACKGROUND ART

Electronic devices refer to devices that perform particular functions based on embedded programs, such as home appliances, electronic notes, portable multimedia players (PMPs), and mobile communication terminals, tablet personal computers (PCs), video/audio devices, desktop/laptop computers, vehicle navigation systems, and so forth. For example, these electronic devices may output stored information in the form of texts, sound, images, and so forth. With the increasing integration of electronic devices and the common use of ultra-high-speed and large-volume wireless communication, various functions have been recently provided through a single mobile communication terminal. For example, an entertainment function such as games, a multimedia function such as music/video playback, a communication and security function for mobile banking, and a function such as schedule management, electronic wallets, or the like, as well as a communication function have been integrated into a single electronic device.

The electronic devices output information such as images, texts, video, and the like through display devices included therein. Having evolved from a vacuum tube form to a flat panel form, the display devices provide large screens by innovatively reducing the volume of home appliances, such as televisions (TVs), and also output high-quality image information or the like through small-size electronic devices such as mobile communication terminals.

As screen sizes in TVs or image devices have increased, a curved type display device may be mounted thereon, taking into account a user's viewing angle. In an electronic device, such as a mobile communication terminal, may be mounted a curved type display device extending to a side surface of the electronic device as well as a front surface of the electronic device, so as to output a large screen while securing portability of the electronic device. A bendable type or flexible display device may also be mounted in the electronic device such that a bendable type electronic device or display device may be received in the electronic device. The bendable type or flexible display device is expected to be conveniently used because of outputting an extended screen and being easy to be miniaturized when being carried.

DISCLOSURE OF INVENTION

Technical Problem

However, unlike in a flat-panel display device, in a curved-type, bendable-type, or flexible display device, a traveling direction of light emitted from the display device is difficult to set or control, making an inconvenient viewing environment such as dazzle.

The above information is presented as background information only to assist with an understanding of the present disclosure. No determination has been made, and no assertion is made, as to whether any of the above might be applicable as prior art with regard to the present disclosure.

Accordingly, various embodiments of the present disclosure provide a curved-type, bendable-type, or flexible display device in which a scattering or traveling path of light depending on a shape or type of the display device is at least partially limited to provide a comfortable viewing environment, and an electronic device including the display device.

Various embodiments of the present disclosure also provide a display device which improves the degree of freedom of design of a bezel disposed on a circumference of a screen display region, and an electronic device including the display device.

Solution to Problem

According to various embodiments of the present disclosure, there is provided a display device including a display element and a guiding portion disposed on the display element, in which the guiding portion guides a traveling path of light emitted from the display element.

The display device and the electronic device including the same may further include a print layer (e.g., a bezel) stacked on the display element along an edge of the display element, and the guiding portion prevents light emitted from the display element from traveling to the print layer, thereby preventing dazzle from occurring due to refraction or scattering of the light on the print layer.

Other aspects, advantages, and salient features of the disclosure will become apparent to those skilled in the art from the following detailed description, which, taken in conjunction with the annexed drawings, discloses exemplary embodiments of the disclosure.

Technical Effect

A display device and an electronic device including the same according to various embodiments of the present disclosure may provide a comfortable viewing environment to users by guiding a traveling path of light emitted from a display element using a guiding portion. For example, the light emitted from the display element is prevented from traveling to a print layer (e.g., a bezel) due to refraction or scattering, thereby preventing dazzle caused by reflection from the print layer. Therefore, it is possible to provide a comfortable viewing environment to users while implementing a curved type, bendable type, or flexible display device. Moreover, by blocking the light traveling from the display element to the print layer, the display device and the electronic device including the same according to various embodiments of the present disclosure may freely design or implement the print layer such that the print layer harmonizes with the exterior of the electronic device or makes the exterior of the electronic device elegant.

MODE FOR THE INVENTION

Figure 1:
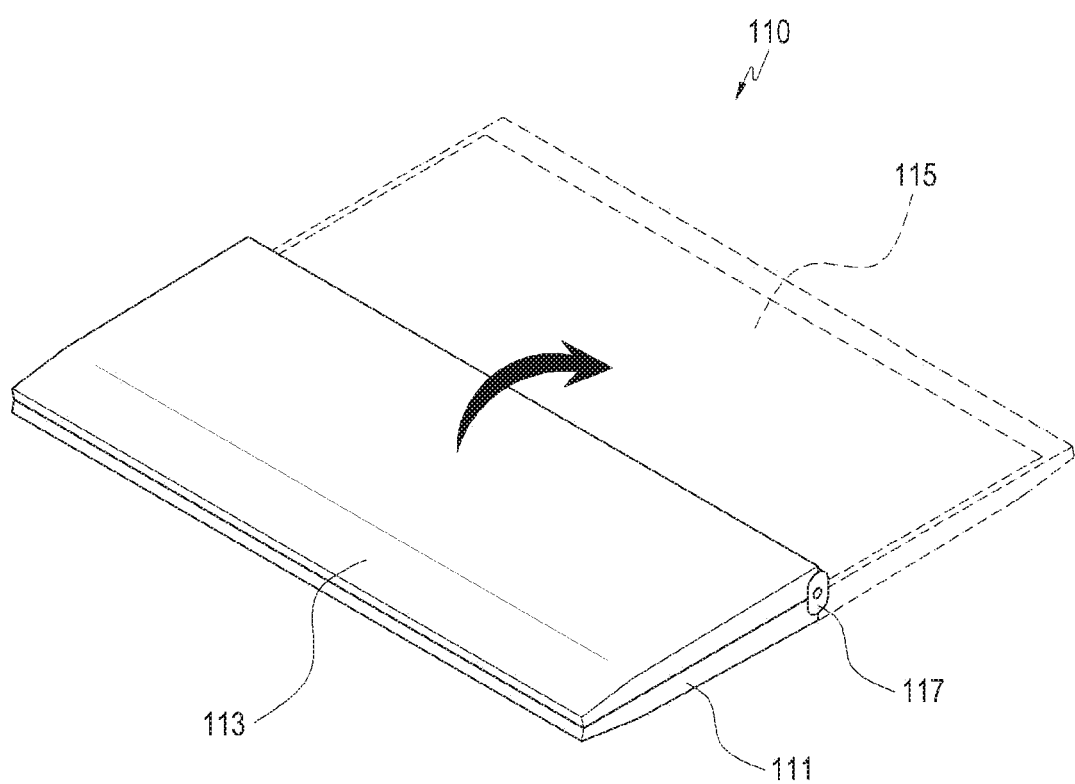
FIG. 1 is a perspective view of an electronic device including a display device according to various embodiments of the present disclosure.

Hereinafter, various embodiments of the present disclosure will be disclosed with reference to the accompanying drawings. However, the description is not intended to limit the present disclosure to particular embodiments, and it should be construed as including various modifications, equivalents, and/or alternatives according to the embodiments of the present disclosure. In regard to the description of the drawings, like reference numerals refer to like elements.

In the present disclosure, an expression such as "A or B," "at least one of A or/and B," or "one or more of A or/and B" may include all possible combinations of together listed items. For example, "A or B," "at least one of A and B," or "one or more of A or B" may indicate the entire of (1) including at least one A, (2) including at least one B, or (3) including both at least one A and at least one B.

Expressions such as "first," "second," "primarily," or "secondary," used herein may represent various elements regardless of order and/or importance and do not limit corresponding elements. For example, a first user device and a second user device may represent different user devices regardless of order or importance. For example, a first element may be named as a second element without departing from the right scope of the various exemplary embodiments of the present disclosure, and similarly, a second element may be named as a first element.

When it is described that an element (e.g., a first element) is "operatively or communicatively coupled" to or "connected" to another element (e.g., a second element), the element can be directly connected to the other element or can be connected to the other element through another element (e.g., a third element). On the other hand, when it is described that an element (e.g., a first element) is "directly connected" or "directly coupled" to another element (e.g., a second element), it means that there is no intermediate element (e.g., a third element) between the element and the other element.

An expression "configured to (or set)" used in the present disclosure may be replaced with, for example, "suitable for," "having the capacity to," "designed to," "adapted to," "made to," or "capable of" according to a situation. A term "configured to (or set)" does not always mean only "specifically designed to" by hardware. Alternatively, in some situation, an expression "apparatus configured to" may mean that the apparatus "can" operate together with another apparatus or component. For example, a phrase "a processor configured (or set) to perform A, B, and C" may be a dedicated processor (e.g., an embedded processor) for performing a corresponding operation or a generic-purpose processor (e.g., a CPU or an application processor) that can perform a corresponding operation by executing at least one software program stored at a memory device.

The terms used in the present disclosure are for the purpose of describing particular exemplary embodiments only and are not intended to be limiting. The singular forms are intended to include the plural forms as well, unless the context clearly indicates otherwise. The term "include" or "has" used in the present disclosure is to indicate the presence of features, numbers, steps, operations, elements, parts, or a combination thereof described in the specifications, and does not preclude the presence or addition of one or more other features, numbers, steps, operations, elements, parts, or a combination thereof.

All of the terms used herein including technical or scientific terms have the same meanings as those generally understood by an ordinary skilled person in the related art unless they are defined other. The terms defined in a generally used dictionary should be interpreted as having meanings that are the same as or similar with the contextual meanings of the relevant technology and should not be interpreted as having ideal or exaggerated meanings unless they are clearly defined in the present disclosure. In some case, terms defined in the present disclosure cannot be analyzed to exclude the present exemplary embodiments.

In various embodiments of the present disclosure, an electronic device may be an arbitrary device having a touch panel and may be referred to as a terminal, a portable terminal, a mobile terminal, a communication terminal, a portable communication terminal, a portable mobile terminal, a display, or the like.

For example, the electronic device may be a smart phone, a cellular phone, a navigation device, a game console, a television (TV), a vehicle head unit, a laptop computer, a tablet computer, a personal media player (PMP), a personal digital assistant (PDA), or the like. The electronic device may be implemented with a pocket-size portable communication terminal having a wireless communication function. The electronic device may be a flexible device or a flexible display.

The electronic device may communicate with an external electronic device such as a server or may work by cooperating with the external electronic device. For example, the electronic device may transmit an image captured by a camera and/or position information detected by a sensor unit to the server over a network. The network may be, but not limited to, a mobile or cellular communication network, a local area network (LAN), a wireless local area network (WLAN), a wide area network (WAN), Internet, a small area network (SAN), or the like.

Figure 2:
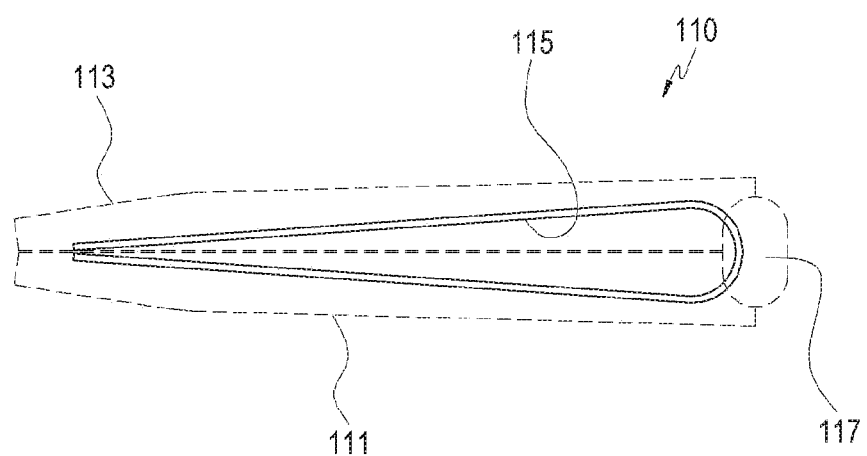
FIG. 2 is a cross-sectional view of an electronic device including a display device according to various embodiments of the present disclosure.

FIG. 1 is a perspective view of an electronic device 110 including a display device 115 according to various embodiments of the present disclosure. FIG. 2 is a cross-sectional view of the electronic device 110 including the display device 115 according to various embodiments of the present disclosure.

Referring to FIGS. 1 and 2, the electronic device 110 including the display device 115 according to various embodiments of the present disclosure may be a folder-type electronic device in which a pair of first and second housings 111 and 113 are pivotably coupled by a hinge apparatus 117. The display device 115 is a bendable-type display device, and a part of the display device 115 may be disposed and mounted on the first housing 111 and another part of the display device 115 may be disposed and mounted on the second housing 113. The display device 115 may have a touch panel integrated therein for use as an input device. For example, the display device 115 may provide a virtual keypad on a region thereof, such that a user may conveniently input desired information even if the electronic device 110 does not include a physical keypad.

In a bent state of the first housing 111 and the second housing 113, the display device 115 is transformed to a curved type or shape having a predetermined curvature at a position adjacent to the hinge apparatus 117, thus being bent together with the first housing 111 and the second housing 113. When the first housing 111 and the second housing 113 are unbent by pivoting with respect to each other, the display device 115 is also unbent in a flat-panel shape to output a screen. Thus, the user may simply carry the electronic device 110 by bending the first housing 111 and the second housing 113, and may unbend the first housing 111 and the second housing 113 for use and view various information (e.g., images, texts, video, etc.) output on a large screen. Moreover, as mentioned above, a virtual keypad may be implemented with the display device 115 when necessary, such that the user may store or output desired information or the like through the electronic device 110.

Figure 3:
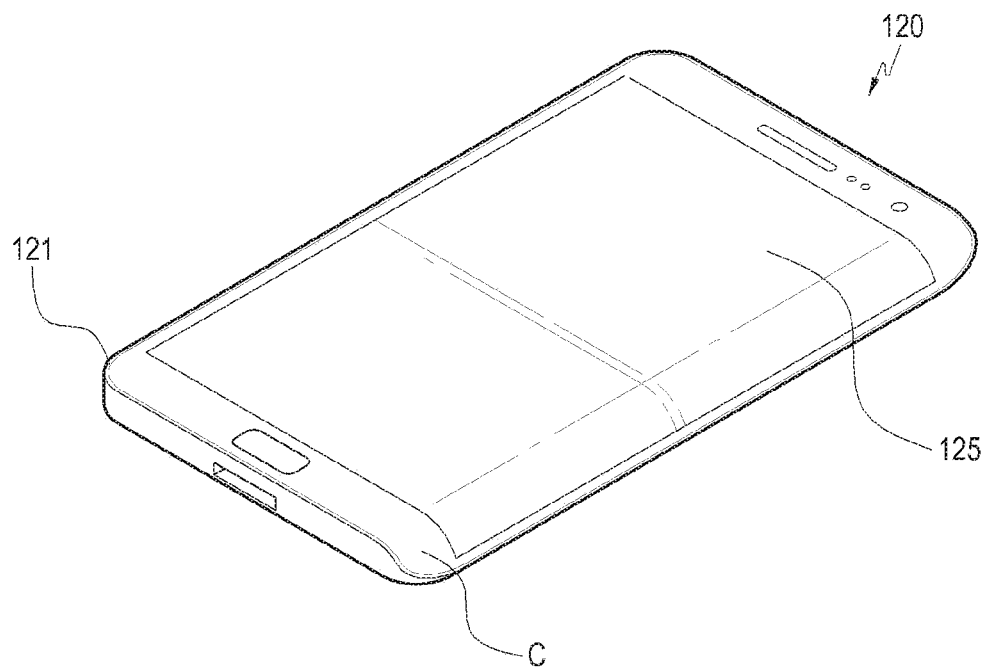
FIG. 3 is a perspective view of another example of an electronic device including a display device according to various embodiments of the present disclosure.

FIG. 3 is a perspective view of an electronic device 120 including a display device 125 according to various embodiments of the present disclosure.

Referring to FIG. 3, the electronic device 120 is a bar-type electronic device in which at least a part of a surface (e.g., a front surface) of a housing 121 may include a curved surface C. The display device 125 mounted on the electronic device 120 is mounted on the surface of the housing 121 to form a curved surface corresponding to the curved surface C of the housing 121. Although a part of the surface of the housing 121, which is adjacent to a side end, includes the curved surface C in the current embodiment, the display device according to various embodiments of the present disclosure may be a curved-type display device, the whole of which has a curvature.

When the electronic device 120 is in an idle mode, the display device 125 outputs information such as a text message, call reception, or the like, on a region corresponding to the curved surface C. Depending on a configuration of the electronic device 120, the display device 125 outputs various information, such as a list of phone numbers, an Internet search window, scheduling notification, and the like, on a region corresponding to the curved surface C. Depending on a configuration of the electronic device 120, the display device 125 outputs information about a now-playing video file, a subtitle of the video file, information such as a text message or the like received during playback of the video file, a live new provided from a service provider, and so forth, in a video play mode. A method for outputting or controlling various information through the display device 125 may be implemented variously depending on a configuration of the electronic device 125, but a detailed description thereof will be omitted.

As such, the electronic device according to various embodiments of the present disclosure may include a display device, at least a part of which is transformed into a curved shape or type or which includes at least a partial curved surface. In the following embodiments, the guiding portion is provided on the display device and is disposed to correspond to a portion of the display device transformable to a curved surface or a curved surface portion of the display device. As will be described further in detail, the guiding portion is formed on the entire area of the display device or a part thereof, and guides a traveling direction of a part of light emitted from the display device, preventing dazzle from occurring when the user enjoys contents through the display device.

Figure 4:
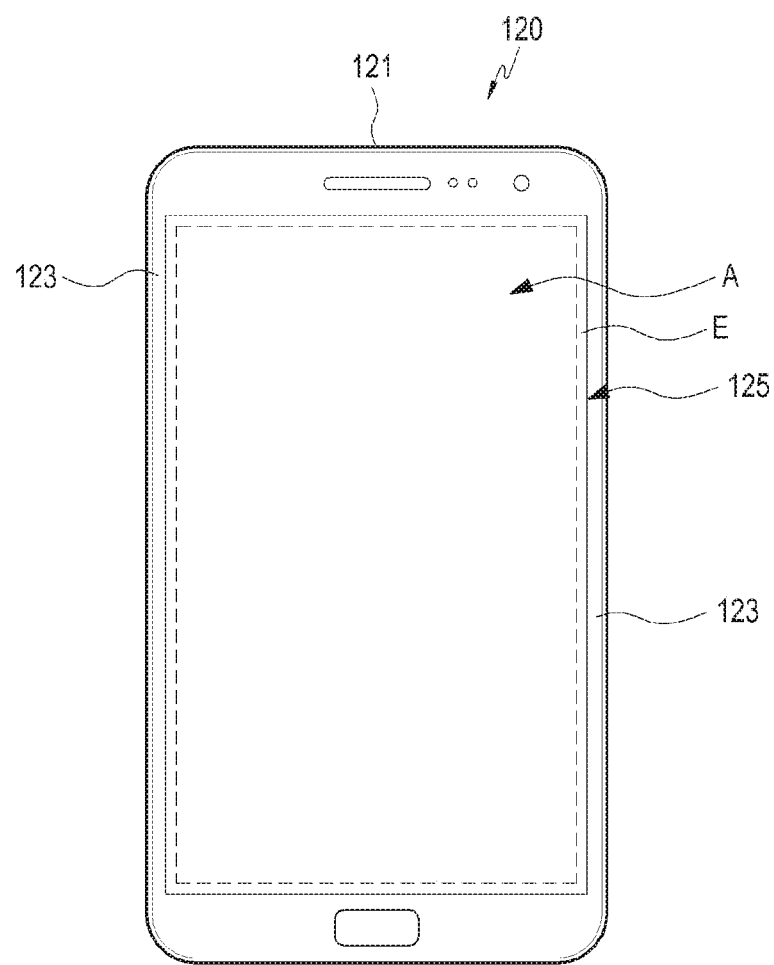
FIG. 4 is a plane view of a display device according to various embodiments of the present disclosure.

FIG. 4 is a plane view of a display device according to various embodiments of the present disclosure.

Referring to FIG. 4, the display device 125 is disposed across the entire surface of the housing 121 of the electronic device 120. The display device 125 may include a guiding portion disposed on at least a part of a screen display region A, e.g., on or along an edge portion E, and a print layer (e.g., a bezel) 123 on or along a circumference of the screen display region A (e.g., a circumference of the guiding portion). While the display device 125 is illustrated in a flat-panel shape because of being illustrated in a plane view in FIG. 4, the display device 125 may be implemented as a bendable-type (or flexible) display device or a curved-type display device as stated above. In the following detailed description, an expression such as 'curved type', 'bendable type', 'flexible', or the like may be used alone, but the expression may indicate an element that is of a curved type and a bendable type and is flexible even if the expression is used alone. An expression 'transformable to a curved surface' may mean that the display device may be used in a flat panel state or a curved surface state. For example, the electronic devices 110 and 120 including a display device in a curved surface state are illustrated in a detailed embodiment of the present disclosure, but the present disclosure may not be limited to this illustration and the display device according to various embodiments of the present disclosure may also be applied to an electronic device including a flat-panel display device.

Hereinafter, a detailed structure of a display device according to various embodiments of the present disclosure will be described with reference to FIGS. 7 through 15. Before describing the structure of the display device according to various embodiments of the present disclosure, a structure of a general display device will be briefly described with reference to FIGS. 5 and 6.

Figure 5:
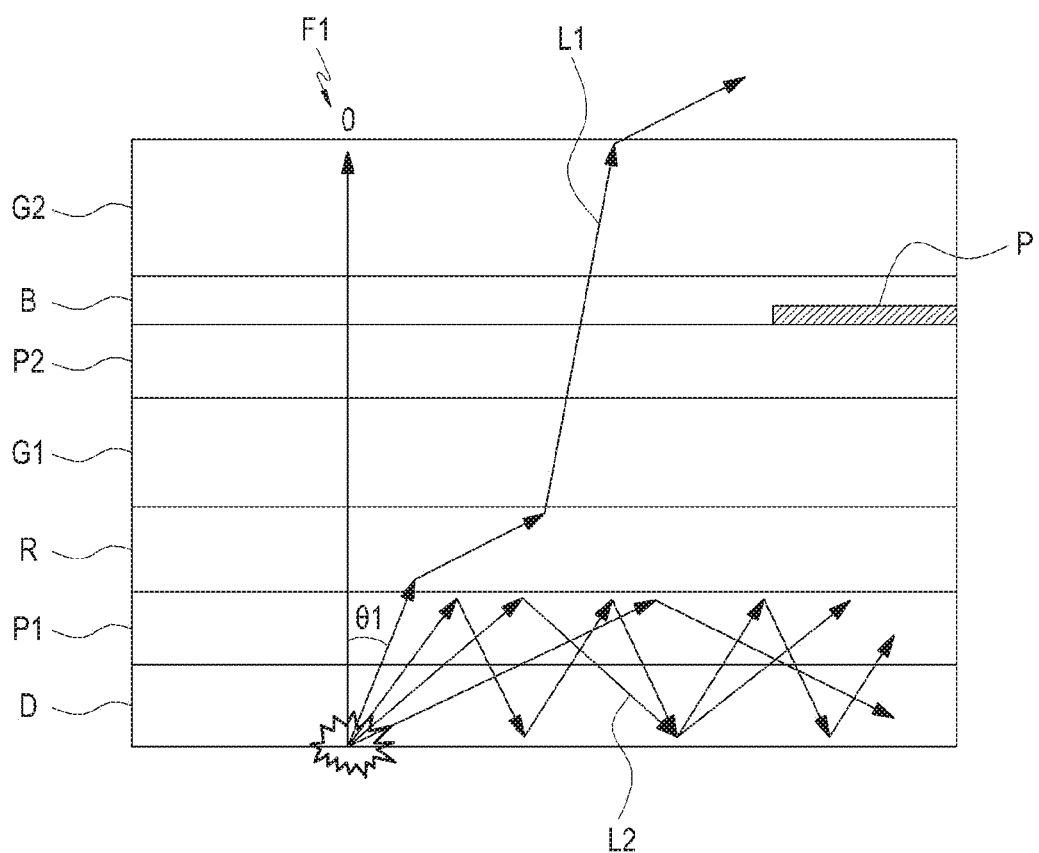
FIG. 5 is a cross-sectional view of a general flat-panel display device.

FIG. 5 is a cross-sectional view of a general flat-panel display device F1.

Referring to FIG. 5, the illustrated flat-panel display device F1 is mounted on an electronic device while maintaining a flat panel shape and may be implemented by stacking a display element D, at least one polarization plates P1 and P2, at least one first and second window members G1 and G2, and at least one adhesive layer B. A print layer P is formed on an edge or circumference of the display element D.

The display element D may include, for example, a liquid crystal display (LCD), a light emitting diode (LED) display, an organic light emitting diode (OLED) display, a microelectromechanical system (MEMS) display, or an electronic paper display. The display element D outputs visual contents (e.g., a text, an image, video, an icon, a symbol, etc.) provided to a user.

The polarization plates P1 and P2 may include a lower polarization plate P1 and an upper polarization plate P2 that are disposed having the first window member G1 therebetween. The lower polarization plate P1 is attached onto a surface of the display element D, and an air layer R is formed between the lower polarization plate P2 and the first window member G1. For example, the first window member G1 may be used as an encapsulation member for forming the air layer R on the lower polarization plate P1. The upper polarization plate P2 is attached onto the first window member G2.

The second window member G2 is stacked on the upper polarization plate P2. When the second window member G2 is stacked and mounted, the adhesive layer B formed of an optical clear adhesive (OCA) may be formed between the upper polarization plate P2 and the second window member G2. The second window member G2 is made of a material such as synthetic resin, glass, or the like to protect internal parts (e.g., the display element D) from an external environment and to transmit visual information output from the display element D therethrough.

The print layer P is disposed on an edge or a circumference of the display element D, and is stacked on the display element D at a position, such as on an inner surface of the second window member G2, an outer surface (or an inner surface) of the upper polarization plate 2, an outer surface (or an inner surface) of the first window member G1, or the like.

In the flat panel display device F1, light emitted from the display element D travels in the following path.

Parts (e.g., the lower polarization plate P1, the upper polarization plate P2, the first window member G1, the second window member G2, etc.) stacked on the display element D may have different refractive indices depending on characteristics of materials of the parts. For example, light emitted from the display element D is refracted in different directions while passing through interfaces between the parts.

To be more specific, light L1 emitted from the display element to travel in an angle range within a first angle θ1 with respect to a forward direction O may travel to the outside of the second window member G2, even if being refracted through the air layer R. On the other hand, light L2 traveling in an angle range beyond the first angle θ1 may be totally reflected on an interface between the lower polarization plate P1 and the air layer R and thus travel inside the lower polarization plate P1 and the display element D. For example, it is possible to prevent light emitted from the display element D from traveling at a larger angle than the first angle θ1 and thus leaking outside or moving to the print layer P.

Figure 6:
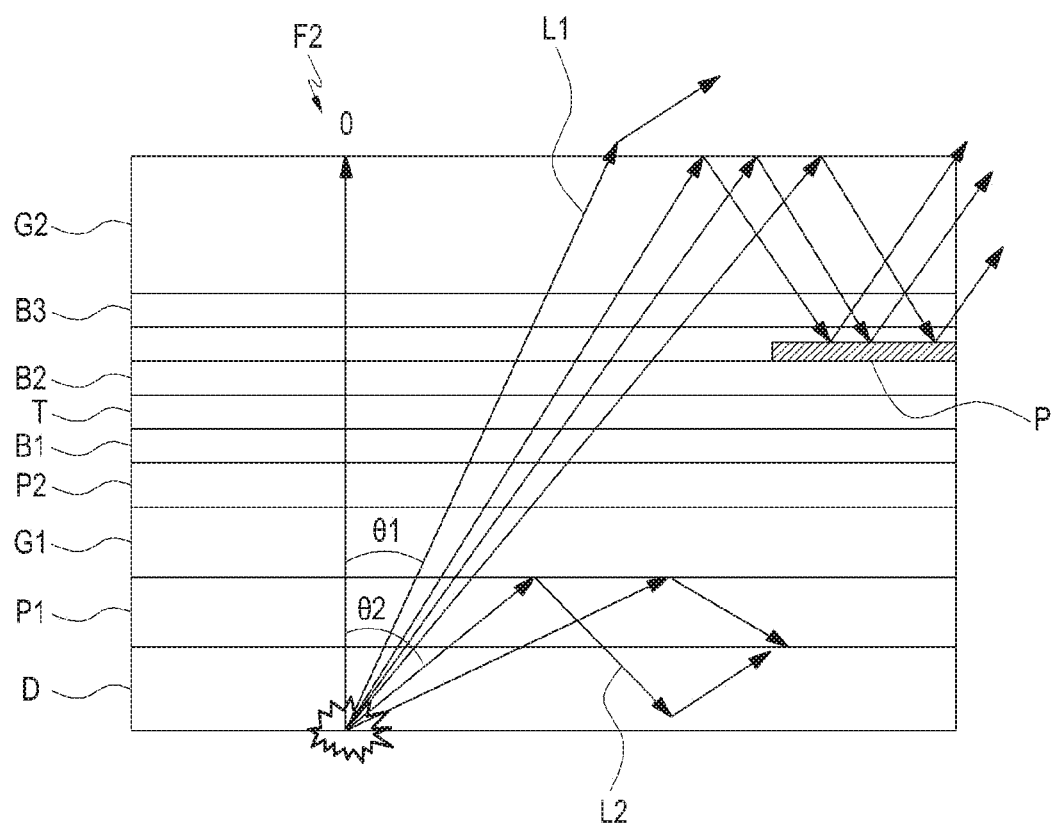
FIG. 6 is a cross-sectional view of a general curved-type display device.

FIG. 6 is a cross-sectional view of a general flat-panel display device F2.

Although the display device F2 is illustrated to have a flat panel shape in FIG. 6, this illustration is intended for brevity of the drawing, such that the display device F2 may be a curved-type, bendable-type, or flexible display device. In the curved-type, bendable-type, or flexible display device, unlike in the above-described flat-panel display device F1, the air layer R may be difficult to form. For example, the above-described flat-panel display device F1 may maintain a flat panel shape to maintain an interval between the first window member G1 and the lower polarization plate P1 constant, but when the curved-type, bendable-type, or flexible display device F2 includes an air layer, two parts disposed to face each other having the air layer therebetween may interfere with each other in a portion transformed into a curved surface. Interference between two parts disposed to face each other having the air layer therebetween on the display element may cause distortion of an output screen (or an output image). Thus, in the curved-type, bendable-type, or flexible display device F2, the air layer is removed, thus maintaining constant arrangement of the parts over the entire screen display region.

Like the flat-panel display device F1, the display device F2 may include the display element D, the upper and lower polarization plates P1 and P2, the first and second window members G1 and G2, adhesive layers B1, B2, and B3, and the print layer P, and may have a touch panel T integrated therein to provide a touch screen function. It should be noted that elements of the display device F2, which may be easily understood from the structure and elements of the above-described flat-panel display device F1, will not be described in detail.

The display element D may include an organic light-emitting diode (OLED) display that is easy to process for flexibility. The first window member G1 and the second window member G2 may be formed of thin films to facilitate transformation of the display device F2 into a curved shape or type. The touch panel T is disposed between the second window member G2 and the upper polarization plate P2 and generates an input signal by detecting a touch by a user's body. For example, as the touch panel T is integrated, the display device F2 may provide a function of an input device.

Parts (e.g., the lower polarization plate P1, the upper polarization plate P2, the first window member G1, the second window member G2, etc.) stacked on the display element D may have different refractive indices depending on characteristics of materials of the parts. Thus, like in the above-described flat-panel display device F2, light L1 emitted from the display element D to travel in an angle range within the first angle θ1 with respect to the forward direction may travel to the outside of the second window member G2.

Light traveling from the display element D in a direction corresponding to a larger angle than the first angle θ1 is totally reflected on an interface between parts stacked on the display element D. However, if refractive indices of the parts stacked on the display element D are high and similar to each other, an angle for total reflection (hereinafter, a 'second angle θ2') may be greater than or equal to the first angle θ1.

Moreover, if the display device F2 is transformed into a curved shape, an angle at which light is incident to an interface may be smaller than an angle in which a flat-panel shape is maintained. For example, if some of light emitted from the display element D is incident to an interface at an angle that is larger than the first angle θ1 and smaller than the second angle θ2, the light may leak to the outside or move to the print layer (hereinafter, 'interference light').

Light output in an angle range within the first angle θ1 displays image information the user may perceive, and interference light leaking to the outside may interfere with the image information, thus degrading display quality. Some of the interference light may move to the print layer P by being totally reflected on an interface between the second window member G2 and the outside, thus being reflected or scattered. The light reflected or scattered on the print layer P may cause dazzle, such that the user may feel uncomfortable when watching or viewing information, such as an image, etc., output from the display device F2. When the display device F2 is transformed into a curved shape, relative displacement occurs between a position corresponding to the first angle θ1 and a position corresponding to the second angle θ2 in a flat-panel shape, increasing the interference light.

Figure 7:
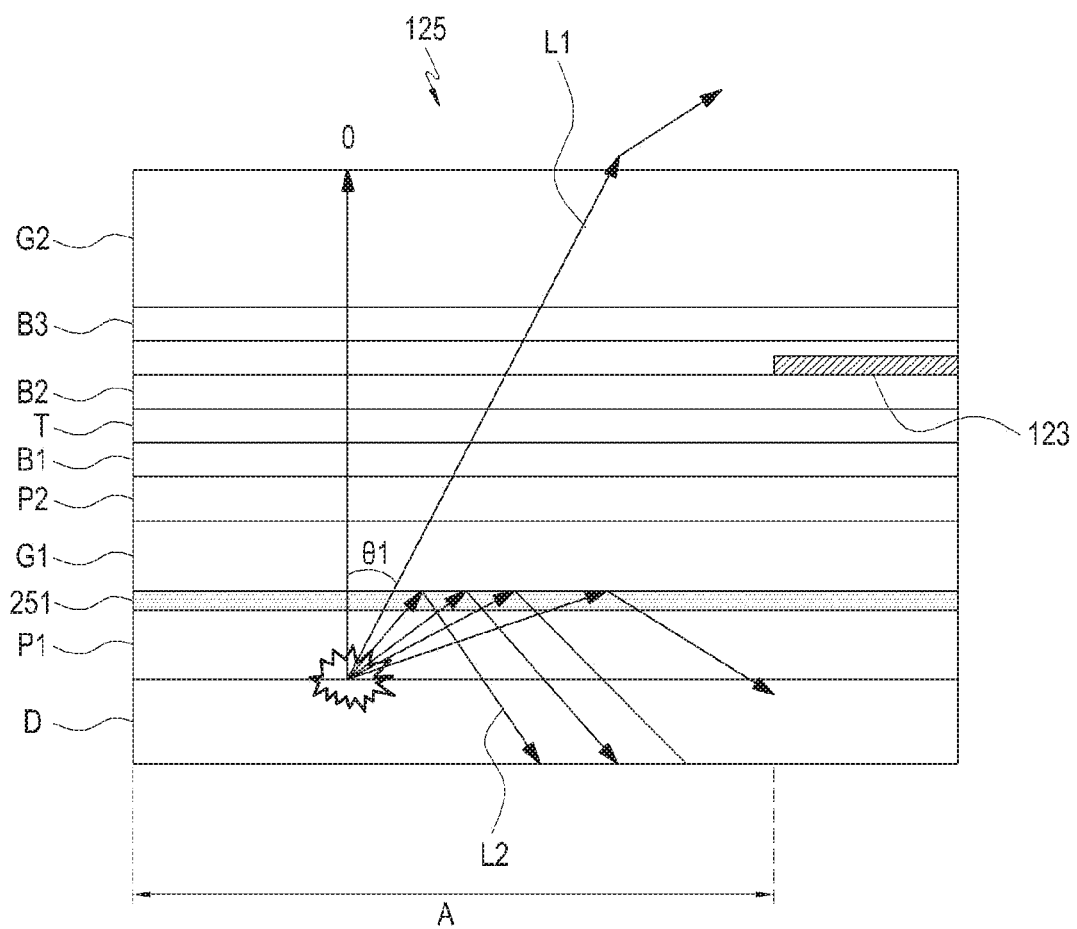
FIG. 7 is a cross-sectional view of a display device according to one of various embodiments of the present disclosure.

FIG. 7 is a cross-sectional view of the display device 125 according to one of various embodiments of the present disclosure.

To describe the display device according to various embodiments of the present disclosure, the structure of the above-described electronic device 110 or 120 or display device 115 or 125 may be referred to.

Referring to FIG. 7, the display device 125 according to one of various embodiments of the present disclosure may include a guiding portion stacked on the display element D. The guiding portion is used to guide a traveling path of light emitted from the display element D, and may be implemented with a low-refractive layer 251 having a refractive index, for example, being greater than or equal to 1; and less than 1.4, to form a low total reflection angle. For example, if information such as an image or the like, which is emitted from the display element D and leaks to the outside, is emitted in an angle range within the first angle θ1, a total reflection angle close to the first angle θ1 may be formed on an interface between the low-refractive layer 251 and an adjacent part thereto.

The display device 125 may include at least one polarization plates P1 and P2, at least one window members G1 and G2, and at least one adhesive layers B1, B2, and B3 which are stacked on the display element D, and may further include a touch panel T to provide a touch screen function. The print layer 123 may be formed on an edge or a circumference of the display element D, and the print layer 123 may form a bezel of the display device 125.

The display element D may be implemented with a display element which is easy to process for flexibility, such as an OLED display, and outputs visual contents (e.g., texts, images, video, icons, symbols, etc.) provided to users.

The polarization plates P1 and P2 may include a lower polarization plate P1 and an upper polarization plate P2 that are disposed having the first window member G1 therebetween. The lower polarization plate P1 is attached onto a surface of the display element D and is combined with the upper polarization plate P2 to set definition or chroma of an image output from the display element D.

The guiding portion including the low-refractive layer 251 is disposed between the lower polarization plate P1 and the first window member G1. The low-refractive layer 251 is formed by depositing a low-refractive-index material, e.g., silicon oxide (SiOx), and a refractive index of the low-refractive layer 251 may be set to be low, e.g., greater than or equal to 1 and less than 1.4. While the low-refractive layer 251 is illustrated as being formed between the lower polarization plate P1 and the first window member G1 in the current embodiment, the low-refractive layer 251 may be formed at any position between the display element D and the print layer 23. For example, the low-refractive layer 251 may be formed between the upper polarization plate P2 and the first window member G1 or between the upper polarization plate P2 and the touch panel T.

The first window member G1 may separate the display element D from an external environment to prevent the display element D from being contaminated by a foreign substance or moisture. Moreover, the first window member G1 may be formed of a thin film to facilitate transformation of the display device 125 into a curved shape.

The second window member G2 is stacked on the upper polarization plate P2. When the second window member G2 is stacked and mounted, the adhesive layers B1, B2, and B3 formed of an OCA may be formed between the upper polarization plate P2 and the second window member G2. The second window member G2 may also be formed of a thin film to facilitate transformation of the display device 125 into a curved shape.

The touch panel T may be formed by depositing a transparent conductor on the second window member G2, and in the current embodiment, the touch panel T is disposed in the form of a separate layer (or film) between the second window member G2 and the upper polarization plate P2. To dispose the touch panel T between the second window member G2 and the upper polarization plate P2, the adhesive layers B1 and B2 may be disposed on and under the touch panel T.

The print layer 123 is disposed on an edge or a circumference of the display element D, e.g., the screen display region A, and is stacked on the display element D at a position, such as on an inner surface of the second window member G2, an outer surface (or an inner surface) of the upper polarization plate 2, an outer surface (or an inner surface) of the first window member G1, or the like. In the current embodiment, the print layer 123 is formed between the touch panel T and the second window member G2, and in this case, the print layer 123 may include a film that includes a transparent region corresponding to the screen display region A and a coated edge region. When the print layer 123 is formed of a film, the adhesive layers B2 and B3 may be disposed on and under the print layer 123, respectively.

In the display device 125, light emitted from the display element D travels in the following path.

Parts (e.g., the lower polarization plate P1, the upper polarization plate P2, the first window member G1, the second window member G2, etc.) stacked on the display element D may have different refractive indices depending on characteristics of materials of the parts. For example, light L1 emitted from the display element to travel in an angle range within the first angle θ1 with respect to the forward direction may travel to the outside of the display device 125 after passing through the low-refractive layer 251. On the other hand, the light traveling in a direction corresponding to a larger angle than the first angle θ1 is totally reflected by the low-refractive layer 251 on an interface between the low-refractive layer 251 and an adjacent part thereto (e.g., the lower polarization plate P1 or the first window member G1) and thus travels into the lower polarization plate P1 or the display element D, thereby suppressing generation of interference light. In this way, the definition of an image output to the outside of the display element D may be secured, and the light emitted from the display element D may be prevented from reaching the print layer 123.

Figure 8:
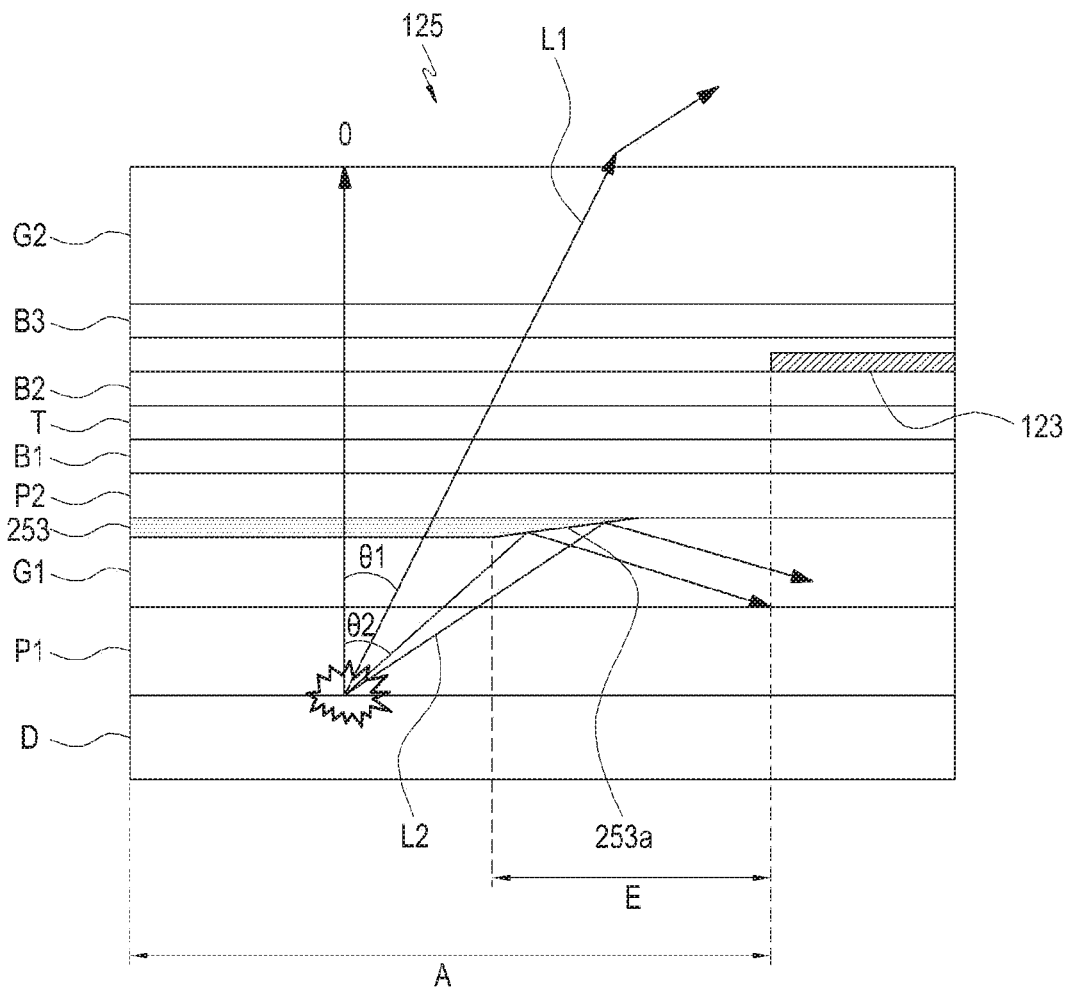
FIG. 8 is a cross-sectional view of a display device according to another one of various embodiments of the present disclosure.

FIG. 8 is a cross-sectional view of the display device 125 according to one of various embodiments of the present disclosure.

When various embodiments of the present disclosure are described, elements that may be easily understood from the above-described embodiment will be given identical reference numerals or omitted, and detailed descriptions thereof will also be omitted.

Referring to FIG. 8, a difference than the above-described embodiment exists in that in the display device 125, when a guiding portion is implemented between the display element D and the print layer 123, a low-refractive layer 253 includes at least one inclined surface 253a.

By forming the inclined surface 253a, an angle at which light emitted from the display element D is incident into the interface between the low-refractive layer 253 and an adjacent part thereto (e.g., the first window member G1) may be increased. For example, an angle at which light emitted from the display element D is incident into the inclined surface 253a on the low-refractive layer 253 may be greater than an angle at which the emitted light is incident onto a flat surface. The inclined surface 253a totally reflects the light emitted from the display element D to cause the light to travel toward the first window member G1, the lower polarization plate P1, or the display element D, thus suppressing generation of interference light, for example, by preventing the light from being incident into the print layer 123 or the like. The inclined surface 253a is formed on an edge portion E in the screen display region A of the display device 125.

According to various embodiments, a plurality of inclined surfaces 253a may be formed and may have different inclination angles depending on their positions. For example, a second inclined surface may be further formed to prevent light emitted from a central portion of the screen display region A from traveling to the print layer 123, and an inclination angle of the second inclined surface may be different from an inclination angle of the inclined surface 253a formed on the edge portion E of the screen display region A. The number, arrangement, and inclination angle of inclined surfaces may be set, taking into account optical characteristics (e.g., a refractive index) of parts (e.g., the first and second window members G1 and G2, the lower and upper polarization plates P1 and P2, the touch panel T, etc.) stacked on the display element D, a traveling path of light based on combinations of the optical characteristics, and so forth.

Figure 9:
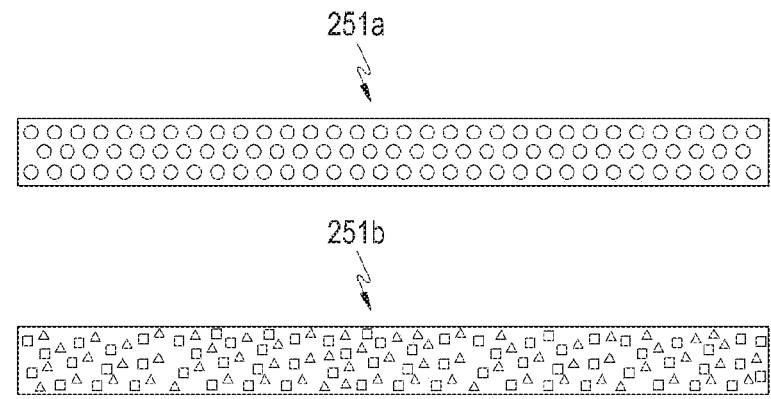
FIG. 9 illustrates low-refractive layers of a display device illustrated in FIGS. 7 and 8, respectively.

FIG. 9 illustrates low-refractive layers of the display device 125 illustrated in FIGS. 7 and 8, respectively.

Referring to FIG. 9, the low-refractive layer(s) 251 and 253 for forming the guiding portion may include a porous structure 251a and a network structure 251b. For example, when the low-refractive layer(s) 251 and 253 are formed by depositing silicon oxide, the low-refractive layer(s) 251 and 253 are formed to include the porous structure 251a or the network structure 251b, thus lowering a deposition density (or film deposition density). As the deposition density of the low-refractive layer(s) 251 and 253 decreases, the refractive index of the low-refractive layer(s) 251 and 253 may also decrease, and by forming the low-refractive layer(s) 251 and 253 with the porous structure 251a or the network structure 251b as described above, the deposition density may be further lowered.

Figure 10:
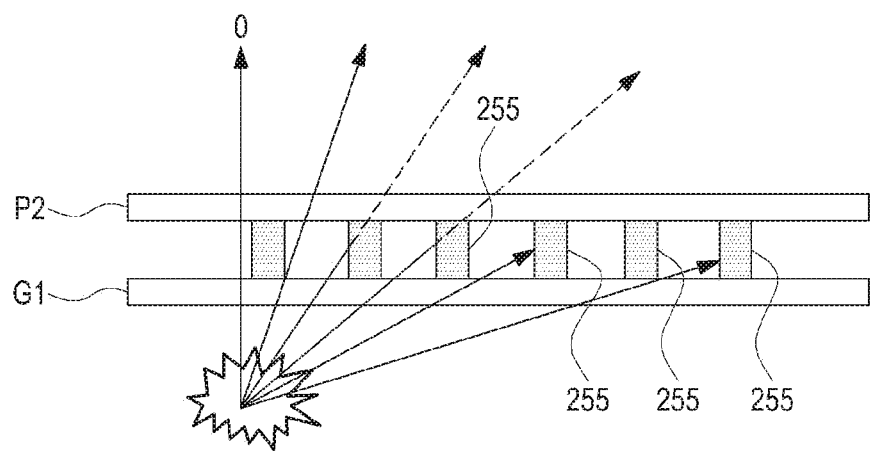
FIG. 10 is a cross-sectional view of a guiding portion of a display device according to another one of various embodiments of the present disclosure.
Figure 11:
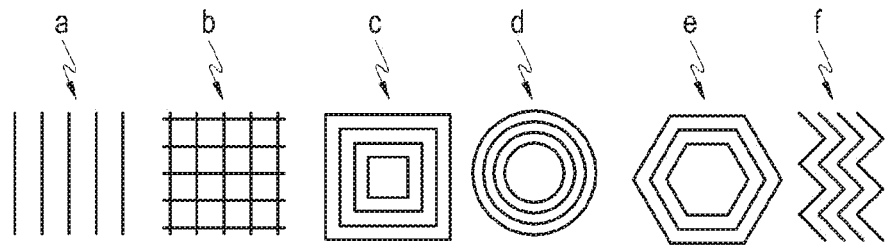
FIG. 11 illustrates a guiding portion of a display device illustrated in FIG. 10.

FIG. 10 is a cross-sectional view of a guiding portion of the display device 125 according to another one of various embodiments of the present disclosure. FIG. 11 illustrates various arrangements of a guiding portion of the display device illustrated in FIG. 10.

As stated above, the guiding portion of the electronic device 110 or 120 or the display device 115 or 125 according to various embodiments of the present disclosure may be disposed on the display element D, for example, between the display element D and the print layer 123. The current embodiment is intended for describing another structure of the guiding portion, and it should be noted that the guiding portion and two parts adjacent to the guiding portion will be described for brevity of the drawings and the detailed description.

Referring to FIGS. 10 and 11, the guiding portion of the display device 125 may include multiple barriers 255 disposed between the first window member G1 and the upper polarization plate P2. The barriers 255 may extend in parallel with each other at a particular interval therebetween, for example, at least partially in parallel with each other, and may be formed of a light-blocking material. For example, when viewed from a plane view as illustrated in FIG. 11, the barriers 255 for forming the guiding portion may be arranged to form parallel arrangement a, lattice pattern arrangement b, polygonal/closed curve arrangement c, d, e, or zigzag pattern arrangement f.

The light emitted from the display element D may be emitted between the barriers 255, such that light emitted in a direction corresponding to a predetermined angle or larger with respect to a screen output direction O of the display device 125 may be blocked by the barriers 255. Thus, for example, light traveling in a direction in which the light is incident into the print layer 123 may be blocked by the barriers 255.

The barriers 255 may be used as spacers for maintaining a constant interval between the first window member G1 and the upper polarization plate P2. For example, an air layer may be formed between the first window member G1 and the upper polarization plate P2, and a high refractive index difference may be implemented on the interface between the formed air layer and the first window member G1. In this way, by forming the guiding portion with the barriers 255, an angle that causes total reflection on a surface of the first window member G1 may be close to a maximum angle (e.g., the first angle θ1) at which the light emitted from the display element D may leak to the outside.

Figure 12:
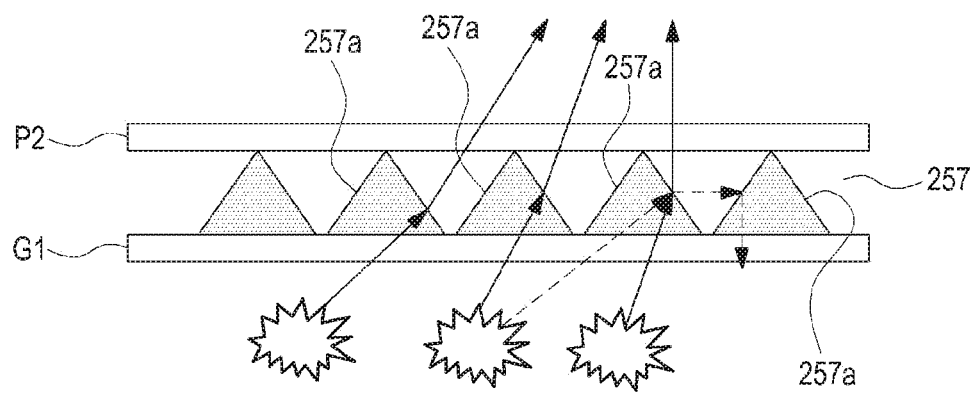
FIG. 12 is a cross-sectional view of a guiding portion of a display device according to another one of various embodiments of the present disclosure.

FIG. 12 is a cross-sectional view of a guiding portion of the display device 125 according to another one of various embodiments of the present disclosure.

The guiding portion of the display element D according to various embodiments of the present disclosure may include a bead layer 257 including multiple protrusions 257a between the display element D and the print layer 123, e.g., the first window member G1 and the upper polarization plate P2. The respective protrusions 257a of the bead layer 257 may refract incident light in different directions, depending on an incident angle of the incident light. For example, if the light emitted from the display element D is incident into an interface between the bead layer 257 and the first window member G1 in an angle direction beyond a predetermined angle (e.g., the first angle θ1), the protrusions 257a refract the incident light to cause the light to travel into the first window member G1. Although the protrusions 257a have a regular triangular shape in the current embodiment, the present disclosure is not limited to this example. For example, the protrusions 257a may have a polygonal shape or a curved shape, and may have a triangular shape without being limited to a regular-triangular shape. The shape of the protrusions 257a may be set variously, taking into account an incident angle of light or a direction in which the light is to be refracted.

Figure 13:
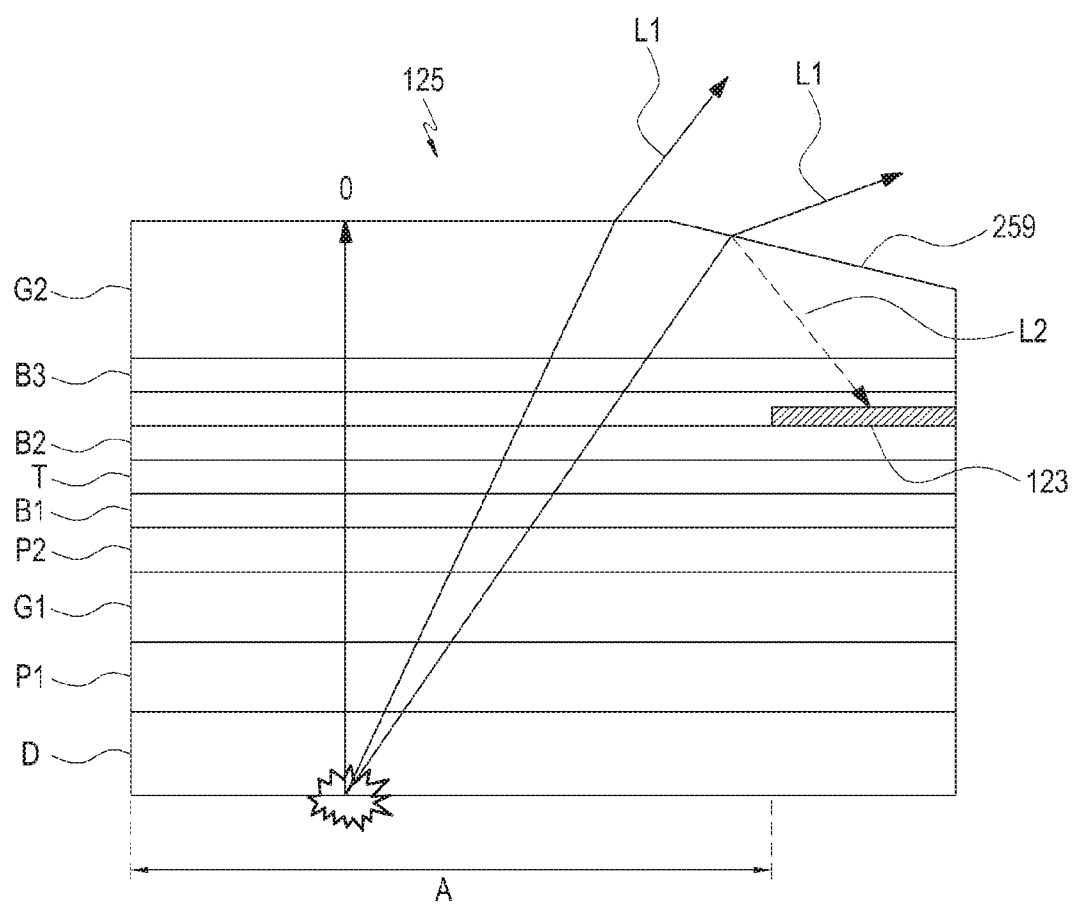
FIG. 13 is a cross-sectional view of a display device according to another one of various embodiments of the present disclosure.
Figure 14:
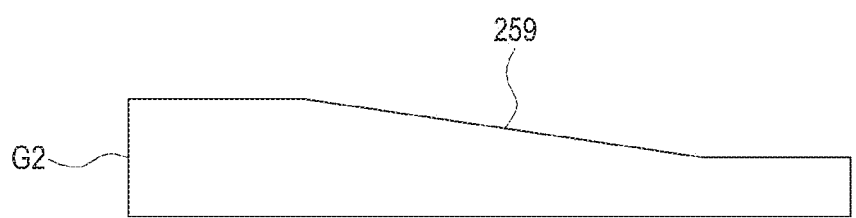
FIGS. 14 and 15 illustrate a guiding portion of a display device illustrated in FIG. 13.
Figure 15:
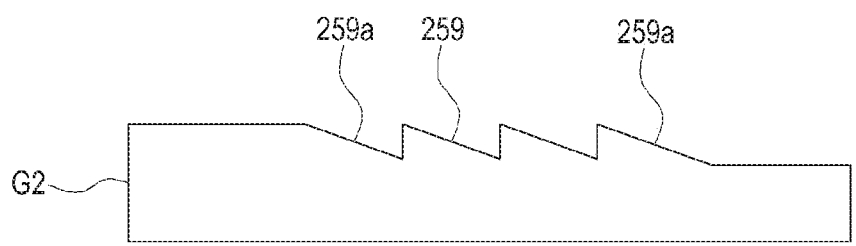

FIG. 13 is a cross-sectional view of the display device 125 according to one of various embodiments of the present disclosure. FIGS. 14 and 15 illustrate a guiding portion of the display device 125 illustrated in FIG. 13.

Referring to FIG. 13, the guiding portion of the display device 125 according to various embodiments of the present disclosure may be disposed upper than the print layer 123 on the display element D. For example, the guiding portion may include an inclined surface 259 formed on an outer surface of the second window member G2, and the print layer 123 may be disposed between the inclined surface 259 and the display element D.

Depending on an angle in which light emitted from the display element D is incident into the interface between the second window member G2 and an external air, some of the light may be totally reflected and be incident into the print layer 123, and the inclined surface 259 may cause the light to leak to the outside and thus prevent the light from being incident into the print layer 123. For example, when traveling in the angle range within the first angle θ1, the light emitted from the display element D may pass through an interface between the second window member G2 and the outside and thus leak to the outside to output image information or the like, and an inclination angle of the inclined surface 259 may be set such that an incident angle of the light emitted from the display element D and incident into the inclined surface 259 is less than the first angle θ1 with respect to the inclined surface 259. As such, the inclined surface 259 may be formed in adjacent to the print layer 123, e.g., at least on an edge portion of a screen display region of the display device 125.

According to various embodiments of the present disclosure, as illustrated in FIGS. 14 and 15, a single inclined surface or a plurality of inclined surfaces may be formed and may have different angles depending on positions thereof. For example, a second inclined surface 259a may be further formed to prevent light emitted from a central portion of the screen display region A from traveling to the print layer 123, and an inclination angle of the second inclined surface 259a may be different from an inclination angle of the inclined surface 259. The number, arrangement, and inclination angle of inclined surfaces may be set, taking into account optical characteristics (e.g., a refractive index) of parts (e.g., the first and second window members G1 and G2, the lower and upper polarization plates P1 and P2, the touch panel T, etc.) stacked on the display element D, a traveling path of light based on combinations of the optical characteristics, and so forth.

Figure 16:
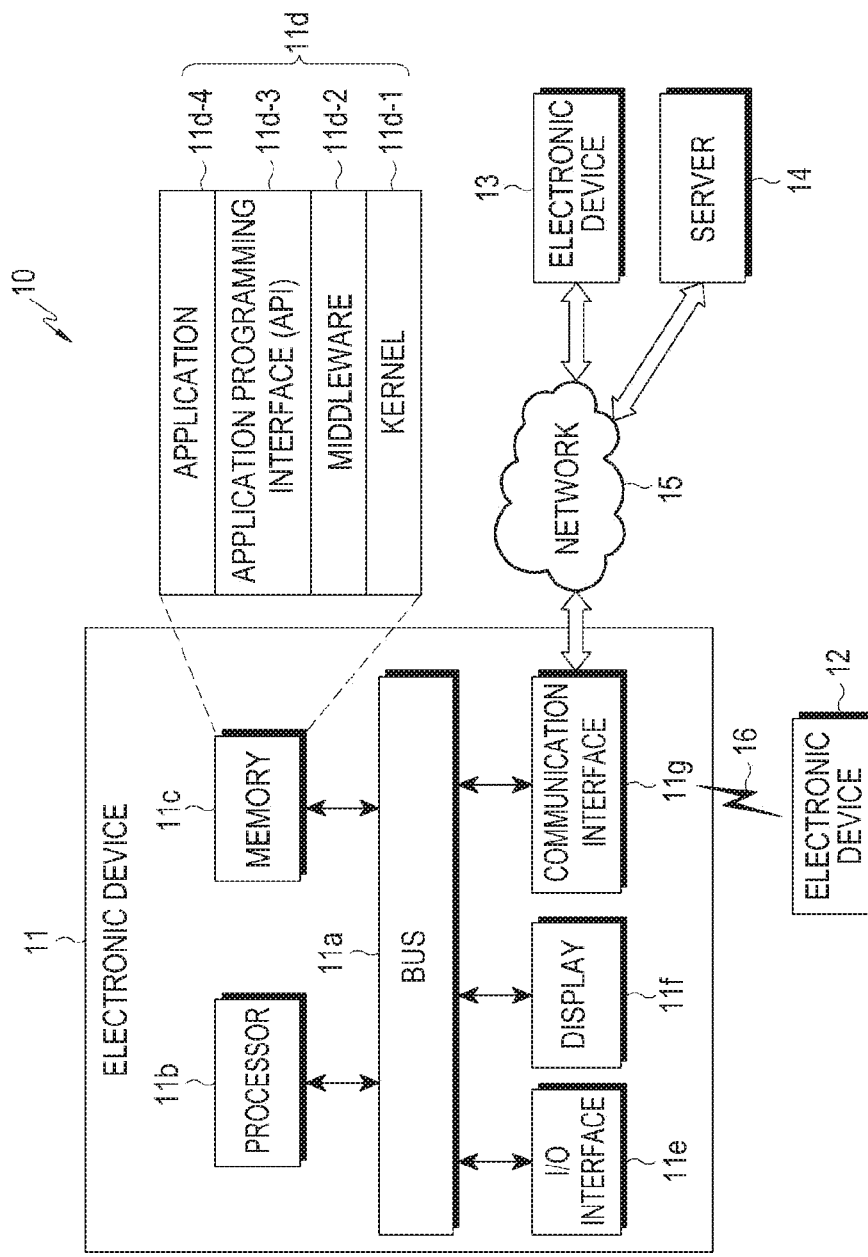
FIG. 16 illustrates a network environment including an electronic device according to various embodiments of the present disclosure.

FIG. 16 illustrates a network environment 10 including an electronic device 11 according to various embodiments of the present disclosure.

Referring to FIG. 16, the electronic device 11 (e.g., the electronic devices 110 and 120) in the network environment 10 according to various embodiments of the present disclosure is disclosed. The electronic device 11 may include a bus 11a, a processor 11b, a memory 11c, an input/output (I/O) interface 11e, a display 11f, and a communication interface 11g. According to some embodiments, the electronic device 11 may omit at least one of the foregoing elements or may further include other elements.

The bus 11a may include a circuit for connecting, e.g., the elements 11a to 17g and delivering communication (e.g., a control message and/or data) between the elements 11a to 17g.

The processor 11b may include one or more of a central processing unit (CPU), an application processor (AP), and a communication processor (CP). The processor 11b performs operations or data processing for control and/or communication of, for example, at least one other elements of the electronic device 11.

The memory 11c may include a volatile and/or nonvolatile memory. The memory 11c may store, for example, commands or data associated with at least one other elements of the electronic device 11. According to an embodiment of the present disclosure, the memory 11c may store software and/or a program 11d. The program 11d may include at least one of, for example, a kernel 11d-1, middleware 11d-2, an application programming interface (API) 11d-3, and/or an application program (or "application") 11d-4, and the like. At least some of the kernel 11d-1, the middleware 11d-2, and the API 11d-3 may be referred to as an operating system (OS).

The kernel 11d-1 controls or manages, for example, system resources (e.g., the bus 11a the processor 11b, the memory 11c, etc.) used to execute operations or functions implemented in other programs (e.g., the middleware 11d-2, the API 11d-3, or the application program 11d-4). The kernel 11d-1 provides an interface through which the middleware 11d-2, the API 11d-3, or the application program 11d-4 accesses separate components of the electronic device 11 to control or manage the system resources.

The middleware 11d-2 may work as an intermediary for allowing, for example, the API 11d-3 or the application program 11d-4 to exchange data in communication with the kernel 11d-1.

In addition, the middleware 11d-2 may process one or more task requests received from the application program 11d-4 based on priorities. For example, the middleware 11d-2 may give a priority for using a system resource (e.g., the bus 11a, the processor 11b, the memory 11c, etc.) of the electronic device 11 to at least one of the application programs 11d-4. For example, the middleware 11d-2 may perform scheduling or load balancing with respect to the one or more task requests by processing the one or more task requests based on the priority given to the at least one of the application programs 11d-3.

The API 11d-3 is an interface used for the application 11d-4 to control a function provided by the kernel -1 or the middleware 11d-2, and may include, for example, at least one interface or function (e.g., a command) for file control, window control, image processing or character control.

The I/O interface 11e serves as an interface for delivering, for example, a command or data input from a user or another external device to other component(s) of the electronic device 11. The I/O interface 11e may also output a command or data received from other component(s) of the electronic device 11 to a user or another external device.

The display 11f may include, for example, a liquid crystal display (LCD), a light emitting diode (LED) display, an organic light emitting diode (OLED) display, a microelectromechanical system (MEMS) display, or an electronic paper display. The display 11f may, for example, display various contents (e.g., a text, an image, video, an icon, a symbol, etc.) to users. The display 11f may include a touch screen, and receives a touch, a gesture, proximity, or a hovering input, for example, by using an electronic pen or a part of a body of a user.

The communication interface 11g sets up communication, for example, between the electronic device 11 and an external device (e.g., a first external electronic device 12, a second external electronic device 13, or a server 14). For example, the communication interface 11g may be connected to a network 15 through wireless communication or wired communication to communicate with an external device (e.g., the second external electronic device 13 or the server 14).

Wired communication may use, for example, as a cellular communication protocol, at least one of, for example, long-term evolution (LTE), LTE-advanced (LTE-A), code division multiple access (CDMA), wideband CDMA (WCDMA), universal mobile telecommunications system (UMTS), wireless broadband (WiBro), global system for mobile communications (GSM), and so forth. The wired communication may include, for example, short-range communication 16. The short-range communication 16 may include, for example, at least one of wireless fidelity (WiFi), Bluetooth, near field communication (NFC), a global navigation satellite system (GNSS), and the like. Depending on a usage area or bandwidth, the GNSS may include, for example, at least one of a global positioning system (GPS), a global navigation satellite system (Glonass), a Beidou navigation satellite system ("Beidou"), and Galileo, the European global satellite-based navigation system. Hereinbelow, "GPS" may be used interchangeably with "GNSS". The wired communication may include, for example, at least one of a USB (universal serial bus), a high definition multimedia interface (HDMI), a recommended standard (RS)-232, a plain old telephone service (POTS), and so forth. The network 15 may include a telecommunications network, for example, at least one of a computer network (e.g., a local area network (LAN) or a wide area network (WAN)), Internet, and a telephone network.

Each of the first external electronic device 12 and the second external electronic device 13 may be a device of the same type as or a different type than the electronic device 11. According to an embodiment of the present disclosure, the server 14 may include a group of one or more servers. According to various embodiments of the present disclosure, some or all of operations performed by the electronic device 11 may be performed in another electronic device or a plurality of electronic devices (e.g., the electronic device 12 or 13, or the server 14). According to an embodiment of the present disclosure, when the electronic device 11 has to perform a function or a service automatically or at a request, the electronic device 11 may request another device (e.g., the electronic devices 12 or 13 or the server 14) to perform at least some functions associated with the function or the service instead of or in addition to executing the function or the service. The another electronic device (e.g., the electronic device 12 or 13 or the server 14) may execute the requested function or additional function and deliver the execution result to the electronic device 11. The electronic device 11 may then process or further process the received result to provide the requested function or service. To this end, for example, cloud computing, distributed computing, or client-server computing may be used.

Figure 17:
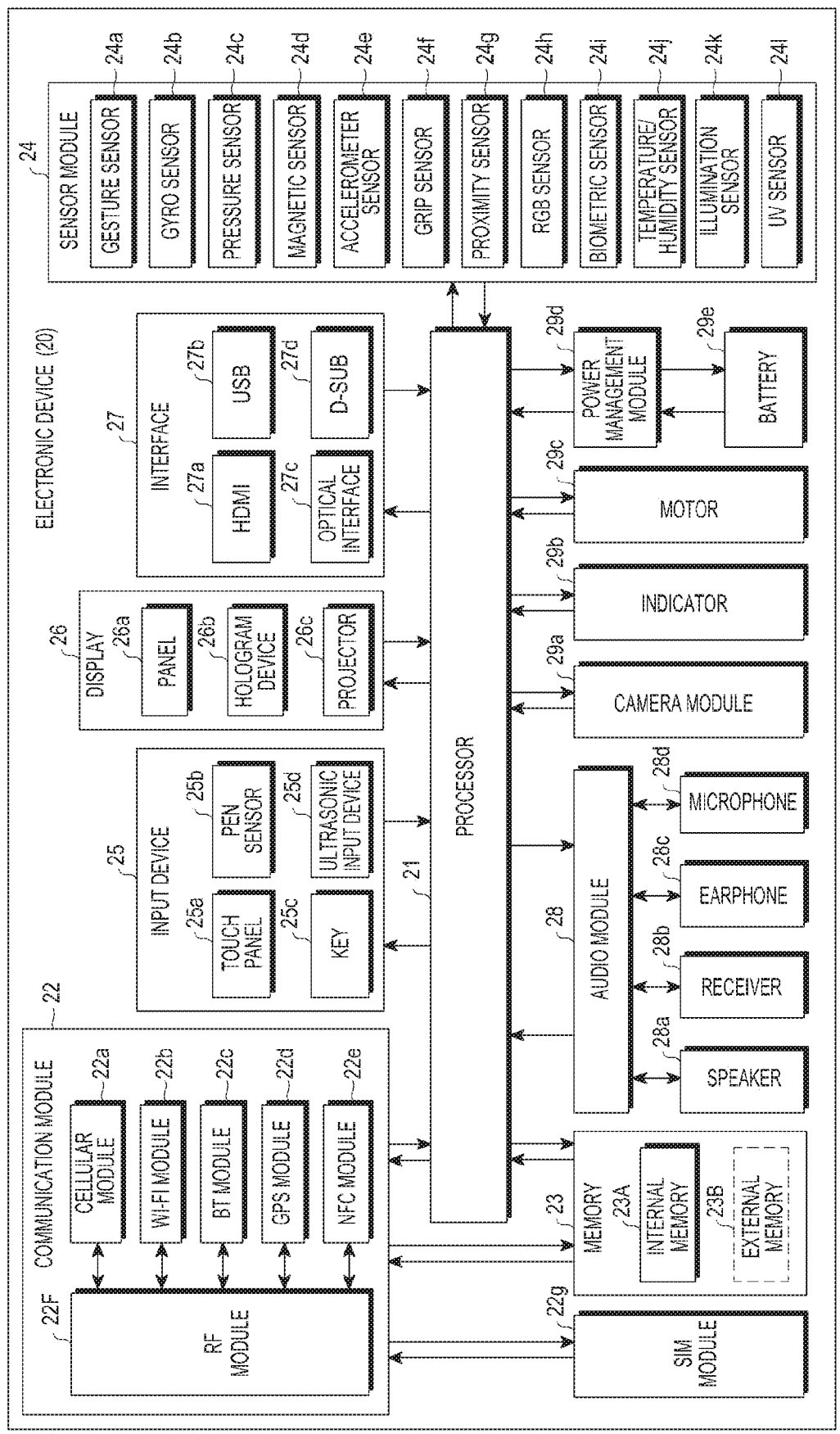
FIG. 17 is a block diagram of an electronic device according to various embodiments of the present disclosure.

FIG. 17 is a block diagram of an electronic device 20 according to various embodiments of the present disclosure. The electronic device 20 may include the entire electronic device 110 or 120 illustrated in FIG. 1 or 3 or the electronic device 11 illustrated in FIG. 14, or a part of the electronic device 110 or 120 or the electronic device 11. The electronic device 20 may include one or more processors (e.g., application processors (APs)) 21, a communication module 22, a subscriber identification module (SIM) 22g, a memory 23, a sensor module 24, an input device 25, a display 26, an interface 27, an audio module 28, a camera module 29a, a power management module 29d, a battery 29e, an indicator 29b, and a motor 29c.

The processor 21 controls multiple hardware or software components connected to the processor 21 by driving an Operating System (OS) or an application program, and performs processing and operations with respect to various data. The processor 21 may be implemented with, for example, a system on chip (SoC). According to an embodiment, the processor 21 may further include a graphic processing unit (GPU) and/or an image signal processor. The processor 21 may include at least some of the elements illustrated in FIG. 17 (e.g., the cellular module 22a). The processor 21 loads a command or data received from at least one of other elements (e.g., a non-volatile memory) into a volatile memory to process the command or data, and stores various data in the non-volatile memory.

The communication module 22 may have a configuration that is the same as or similar to the communication interface 11g illustrated in FIG. 16. The communication module 22 may include, for example, at least one of the cellular module 22a, a WiFi module 22b, a Bluetooth (BT) module 22c, a GNSS module 22d (e.g., a GPS module, a Glonass module, a Beidou module, or a Galileo module), a near field communication (NFC) module 22e, and a radio frequency (RF) module 22f. If the electronic device 110 or 120 includes antenna device(s), the antenna device included in the electronic device 110 or 120 may be connected to the communication module 22.

The cellular module 22a may provide, for example, a voice call, a video call, a text service, or an Internet service over a communication network. According to an embodiment, the cellular module 22a identifies and authenticates the electronic device 20 in a communication network by using the SIM 22g (e.g., a SIM card). According to an embodiment, the cellular module 22a performs at least one of functions that may be provided by the processor 21. According to an embodiment, the cellular module 221 may include a communication processor (CP).

Each of the WiFi module 22b, the BT module 22c, the GNSS module 22d, and the NFC module 22e may include, for example, a processor for processing data transmitted and received by a corresponding module. According to some embodiment, at least some (e.g., two or more) of the cellular module 22a, the WiFi module 22b, the BT module 22c, the GNSS module 22d, and the NFC module 22e may be included in one integrated chip (IC) or IC package.

The RF module 22f may, for example, transmit and receive a communication signal (e.g., an RF signal). The RF module 22f may include a transceiver, a power amplifier module (PAM), a frequency filter, a low noise amplifier (LNA), or an antenna. According to another embodiment, at least one of the cellular module 22a, the WiFi module 22b, the BT module 22c, the GNSS module 22d, and the NFC module 22e may transmit and receive an RF signal through the separate RF module.

The SIM module 22g may include a card including an SIM and/or an embedded SIM, and may include unique identification information (e.g., an integrated circuit card identifier (ICCID) or subscriber information (e.g., an international mobile subscriber identity (IMSI)).

The memory 23 (e.g., the memory 11c) may include an internal memory 23a or an external memory 23b. The internal memory 23a may include at least one of a volatile memory (e.g., dynamic random access memory (DRAM), static RAM (SRAM), synchronous dynamic RAM (SDRAM), etc.), and a non-volatile memory (e.g., one time programmable read only memory (OTPROM), programmable ROM (PROM), erasable and programmable ROM (EPROM), electrically erasable and programmable ROM (EEPROM), etc.), mask ROM, flash ROM, NAND flash memory, NOR flash memory, etc.), and a solid state drive (SSD).

The external memory 23b may further include flash drive, for example, compact flash (CF), secure digital (SD), micro-SD, mini-SD, extreme Digital (xD), a multi-media card (MMC), or a memory stick. The external memory 23b may be functionally and/or physically connected with the electronic device 20 through various interfaces.

The sensor module 24 measures physical quantity or senses an operation state of the electronic device 20 to convert the measured or sensed information into an electric signal. The sensor module 24 may include at least one of a gesture sensor 24a, a gyro sensor 24b, a pressure sensor 24c, a magnetic sensor 24d, an acceleration sensor 24e, a grip sensor 24f, a proximity sensor 24g, a color sensor 24h (e.g., RGB sensor), a biometric sensor 24i, a temperature/humidity sensor 24j, an illumination sensor 24k, and a ultraviolet (UV) sensor 2401. Additionally or alternatively, the sensor module 24 may include an E-nose sensor (not shown), an electromyography (EMG) sensor (not shown), an electroencephalogram (EEG) sensor (not shown), an electrocardiogram (ECG) sensor (not shown), an infrared (IR) sensor, an iris sensor, and/or a fingerprint sensor. The sensor module 24 may further include a control circuit for controlling at least one sensor included therein. In some embodiment, the electronic device 20 may further include a processor configured to control the sensor module 24 as part of or separately from the processor 21, to control the sensor module 24 during a sleep state of the processor 21.

The input device 25 may include, for example, a touch panel 25a, a (digital) pen sensor 25b, a key 25c, or an ultrasonic input device 25d. The touch panel 25a may use at least one of a capacitive type, a resistive type, an IR type, or an ultrasonic type. The touch panel 25a may further include a control circuit. The touch panel 25a may further include a tactile layer to provide tactile reaction to the user.

The (digital) pen sensor 25b may include a recognition sheet which is a part of the touch panel 25a or a separate recognition sheet. The key 25c may also include, for example, a physical button, an optical key, or a keypad. The ultrasonic input device 25d senses ultrasonic waves generated by an input means through a microphone (e.g., the microphone 25d) and checks data corresponding to the sensed ultrasonic waves.

The display 26 (e.g., the display 21f) may include a panel 26a, a hologram device 26b, or a projector 26c. The panel 26a may have a configuration that is the same as or similar to the display 11f illustrated in FIG. 16. The panel 26a may be implemented to be flexible, transparent, or wearable. The panel 26a may be configured with the touch panel 25a in one module. The hologram device 26b shows a stereoscopic image in the air by using interference of light. The projector 26c displays an image onto an external screen through projection of light. The screen may be positioned inside or outside the electronic device 20. According to an embodiment, the display 26 may further include a control circuit for controlling the panel 26a, the hologram device 26b, or the projector 26c.

According to an embodiment, the interface 27 may include a high-definition multimedia interface (HDMI) 27a, a universal serial bus (USB) 27b, an optical interface 27c, or a D-subminiature 27d. The interface 27 may be included in the communication interface 11g illustrated in FIG. 14. Additionally or alternatively, the interface 27 may include a mobile high-definition link (MHL) interface, an SD/multi-media card (MMC) interface, or an Infrared Data Association (IrDA) interface.

The audio module 28 bi-directionally converts sound and an electric signal. At least one element of the audio module 28 may be included in the I/O interface 11d-3 illustrated in FIG. 16. The audio module 28 processes sound information input or output through the speaker 28a, the receiver 28b, the earphone 28c, or the microphone 28d.

The camera module 29a is, for example, a device capable of capturing a still image or a moving image, and according to an embodiment, may include one or more image sensors (e.g., a front sensor or a rear sensor), a lens, an image signal processor (ISP), or a flash (e.g., an LED, a xenon lamp, etc.).

The power management module 29d manages power of the electronic device 20. According to an embodiment, the power management module 29d may include a power management integrated circuit (PMIC), a charger IC, or a battery fuel gauge. The PMIC may have a wired and/or wireless charging scheme. The wireless charging scheme includes a magnetic-resonance type, a magnetic induction type, and an electromagnetic type, and for wireless charging, an additional circuit, for example, a coil loop, a resonance circuit, or a rectifier may be further included. The battery gauge measures the remaining capacity of the battery 29e6 or the voltage, current, or temperature of the battery 29e during charging. The battery 29e may include a rechargeable battery and/or a solar battery.

The indicator 29b displays a particular state, for example, a booting state, a message state, or a charging state, of the electronic device 20 or a part thereof (e.g., the processor 21). The motor 29c converts an electric signal into mechanical vibration or generates vibration or a haptic effect. Although not shown, the electronic device 20 may include a processing device (e.g., a GPU) for supporting a mobile TV. The processing device for supporting the mobile TV processes media data according to, a standard such as digital multi-media broadcasting (DMB), digital video broadcasting (DVB), or mediaFlo™.

Each of the foregoing elements described herein may be configured with one or more components, names of which may vary with a type of the electronic device. In various embodiments, the electronic device may include at least one of the foregoing elements, some of which may be omitted or to which other elements may be added. In addition, some of the elements of the electronic device according to various embodiments may be integrated into one entity to perform functions of the corresponding elements in the same manner as before they are integrated.

A term "module" used herein may mean, for example, a unit including one of or a combination of two or more of hardware, software, and firmware. The "module" may be interchangeably used with a unit, a logic, a logical block, a component, or a circuit. The "module" may be a minimum unit or a portion of an integrated component. The "module" may be a minimum unit or a portion thereof performing one or more functions. The "module" may be implemented mechanically or electronically. For example, the "module" according to the embodiments may include at least one of an application-specific integrated circuit (ASIC) chip, field-programmable gate arrays (FPGAs), and a programmable-logic device performing certain operations already known or to be developed.

At least some of apparatuses (e.g., modules or functions thereof) or methods (e.g., operations) according to various embodiments may be implemented with instructions stored in a computer-readable storage medium in a programming module type. When the instructions are executed by one or more processors (e.g., the processor 11b), the one or more processors may perform functions corresponding to the instructions. The computer-readable storage medium may be, for example, a memory included in the memory 11c.

Examples of the computer-readable storage medium may include a hard disk, a floppy disk, a magnetic medium (e.g., a magnetic tape), an optical recording medium (e.g., compact disc read only memory (CD-ROM), digital versatile disc (DVD), a magneto-optic medium (e.g., floptical disk), a hardware device (e.g., read only memory (ROM), random access memory (RAM), flash memory, etc.), and so forth. Further, the program instructions include a machine language code created by a complier and a high-level language code executable by a computer using an interpreter. The foregoing hardware device may be configured to be operated as at least one software module to perform an operation of the present disclosure, or vice versa.

Modules or programming modules according to various embodiments of the present disclosure may include one or more of the foregoing elements, have some of the foregoing elements omitted, or further include additional other elements. Operations performed by the modules, the programming modules or other elements according to various embodiments may be executed in a sequential, parallel, repetitive or heuristic manner. Also, some of the operations may be executed in different order or omitted, or may have additional different operations. The embodiments disclosed herein have been provided for description and understanding of disclosed technical matters, and are not intended to limit the scope of the present disclosure. Therefore, it should be construed that the scope of the present disclosure includes any change or other various embodiments based on the technical spirit of the present disclosure.

As described above, according to various embodiments of the present disclosure, a display device is disclosed which includes a display element and a guiding portion disposed on the display element, In which the guiding portion guides a traveling path of light emitted from the display element.

The display device may further include a print layer stacked on the display element along an edge of the display element.

According to various embodiments of the present disclosure, the guiding portion may include a low-refractive layer stacked between the display element and the print layer, and the low-refractive layer may totally reflect light that is emitted from the display element and travels toward the print layer.

According to various embodiments of the present disclosure, the low-refractive layer may have a refractive index that is greater than or equal to 1 and less than 1.4.

The low-refractive layer may have a network structure or a porous structure including air pockets.

According to various embodiments of the present disclosure, the guiding portion may include at least one inclined surface formed on the low-refractive layer, and the inclined surface may be formed in adjacent to the print layer along an edge of a screen display region of the display element.

According to various embodiments of the present disclosure, the guiding portion may include a plurality of barriers formed between the display element and the print layer, and light emitted from the display element may travel between the barriers.

According to various embodiments of the present disclosure, the barriers may be formed in adjacent to the print layer along an edge of a screen display region of the display element.

According to various embodiments of the present disclosure, two barriers, which are adjacent to each other, among the barriers, may be arranged at least partially in parallel with each other.

According to various embodiments of the present disclosure, the guiding portion may include a bead layer including a plurality of protrusions formed between the display element and the print layer, and the bead layer may change a traveling path of light that is emitted from the display element and travels toward the print layer.

The display device may further include a window member disposed to face the display element, having the print layer therebetween, and the guiding portion may include at least one inclined surface that is formed in adjacent to the print layer on a surface of the window member along an edge of a screen display region of the display element.

According to various embodiments of the present disclosure, the inclined surface may cause light, which is emitted from the display element and is incident into the inclined surface, to travel to outside of the window member.

An electronic device according to various embodiments of the present disclosure includes at least one of the above-described various display devices.

According to various embodiments of the present disclosure, the electronic device may further include a first housing and a second housing that is hinge-coupled to the first housing to be bent on the first housing or unbent in parallel with the first housing, in which a portion of the display device is mounted on the first housing and another portion of the display device is mounted on the second housing, such that the display device is bent or unbent together with the second housing.

According to various embodiments of the present disclosure, the electronic device may further include a housing having a surface, at least a portion of which comprises a curved surface, in which the display device is mounted on a surface of the housing, such that at least a portion of the display device comprises a curved surface.

While embodiments of the present disclosure have been described, various changes may be made without departing the scope of the present disclosure.

The invention claimed is:

1. A display device comprising:
   a display element;
   a window member disposed over the display element;
   a print layer disposed between the window member and a circumference of a screen display region of the display element; and
   a guiding portion disposed between the window member and at least a part of the screen display region of the display element, and disposed adjacent to the display element,
   wherein the guiding portion guides a traveling path of light emitted from the display element, and
   wherein when the light emitted from the display element is emitted at a predefined angle and an angle less than the predefined angle, the light emitted passes through the guiding portion, and when the light emitted from the display element is emitted at an angle greater than the predefined angle, the light emitted is incident to one surface of the guiding portion and is reflected toward the display element.

2. The display device of claim 1, wherein the display element comprises at least a partial curved surface or at least a portion of the display element is transformable to a curved shape.

3. The display device of claim 2, wherein the print layer is stacked on the display element along an edge of the display element.

4. The display device of claim 3, wherein the guiding portion comprises a low-refractive layer stacked between the display element and the print layer, and the low-refractive layer is configured to provide complete reflection of a ray of light that is emitted from the display element and travels toward the print layer.

5. The display device of claim 4, wherein the low-refractive layer has a refractive index that is greater than or equal to 1 and less than 1.4.

6. The display device of claim 4, wherein the low-refractive layer has a network structure or a porous structure comprising air pockets.

7. The display device of claim 4, wherein the guiding portion comprises at least one inclined surface formed on the low-refractive layer, and the inclined surface is formed adjacent to the print layer along an edge of a screen display region of the display element.

8. The display device of claim 3, wherein the guiding portion comprises a plurality of barriers formed between the display element and the print layer, and light emitted from the display element travels between the plurality of barriers.

9. The display device of claim 8, wherein the plurality of barriers are formed adjacent to the print layer along an edge of a screen display region of the display element.

10. The display device of claim 8, wherein two barriers, which are adjacent to each other among the plurality of barriers, are arranged at least partially in parallel with each other.

11. The display device of claim 3, wherein the guiding portion comprises a bead layer comprising a plurality of protrusions formed between the display element and the print layer, and the bead layer changes a traveling path of light that is emitted from the display element and travels toward the print layer.

12. A display device comprising:

a display element;

a window member disposed over the display element;

a print layer disposed between the window member and a circumference of a screen display region of the display element; and a guiding portion disposed between the window member and at least a part of the screen display region of the display element, and disposed adjacent to the display element, wherein the guiding portion guides a traveling path of light emitted from the display element, wherein when the light emitted from the display element is emitted at a predefined angle and an angle less than the predefined angle, the light emitted passes through the guiding portion, and when the light emitted from the display element is emitted at an angle greater than the predefined angle, the light emitted is incident to one surface of the guiding portion and is reflected toward the display element, and wherein the guiding portion comprises one or more layers having at least one of refractive indexes that is greater than or equal to 1 and less than 1.4, a network structure, a porous structure comprising air pockets, a partially inclined surface, a plurality of barriers therein, or a plurality of protrusions formed on.

13. The display device of claim 12, wherein the display element comprises at least a partial curved surface or at least a portion of the display element is transformable to a curved shape.

14. The display device of claim 12, wherein the print layer is stacked on the display element along an edge of the display element.

15. The display device of claim 12, wherein the inclined surface is formed adjacent to the print layer along an edge of a screen display region of the display element.

16. The display device of claim 12, wherein the light emitted from the display element travels between the plurality of barriers.

17. The display device of claim 12, wherein the plurality of barriers are formed adjacent to the print layer along an edge of a screen display region of the display element.

18. The display device of claim 12, wherein two barriers, which are adjacent to each other among the plurality of barriers, are arranged at least partially in parallel with each other.

19. The display device of claim 12, wherein the guiding portion comprising the plurality of protrusions changes a traveling path of light that is emitted from the display element and travels toward the print layer.

* * * * *